(12) United States Patent
Herrera (10) Patent No.: US 9,473,075 B2
(45) Date of Patent: Oct. 18, 2016

(54) DYNAMIC CURRENT SOURCE FOR AMPLIFIER INTEGRATOR STAGES

(71) Applicant: ANALOG DEVICES, INC., Norwood, MA (US)

(72) Inventor: Sandro Herrera, Medford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 91 days.

(21) Appl. No.: 14/341,364

(22) Filed: Jul. 25, 2014

(65) Prior Publication Data

US 2016/0028355 A1  Jan. 28, 2016

(51) Int. Cl.
*H03F 3/26* (2006.01)
*H03F 1/30* (2006.01)
*H03F 3/30* (2006.01)
*H03F 3/345* (2006.01)

(52) U.S. Cl.
CPC ............. *H03F 1/307* (2013.01); *H03F 3/301* (2013.01); *H03F 3/3069* (2013.01); *H03F 3/345* (2013.01); *H03F 2200/264* (2013.01); *H03F 2203/30015* (2013.01); *H03F 2203/30036* (2013.01); *H03F 2203/30061* (2013.01); *H03F 2203/30063* (2013.01)

(58) Field of Classification Search
CPC ...................................................... H03F 3/26
USPC ................................................ 330/263, 267
See application file for complete search history.

(56) References Cited

U.S. PATENT DOCUMENTS 2,663,806 A    12/1953  Darlington
3,801,921 A *   4/1974  Wolf ............................. 330/267
4,039,964 A *   8/1977  Ishii ............................. 330/267
4,390,852 A *   6/1983  Addis ........................... 330/300
4,439,743 A *   3/1984  Schwarz et al. ............... 330/267
5,444,419 A *   8/1995  Honda .......................... 330/266
5,512,859 A *   4/1996  Moraveji ....................... 330/267
6,249,187 B1*   6/2001  Chou et al. ................... 330/288
8,497,736 B1*   7/2013  Leipold et al. ............... 330/267

OTHER PUBLICATIONS

Horowitz et al., "Chapter 2: Transistors", The Art of Electronics, Second Edition, 1989, pp. 61-111, Cambridge University Press.
Hodges, "Darlington's Contributions to Transistor Circuit Design", IEEE Transactions on Circuits and Systems—Fundamental Theory and Applications, vol. 46, No. 1, Jan. 1999, pp. 102-104.
Texas Instruments, "AN-272 Op Amp Booster Designs", Application Report SNOA600B, Sep. 1981—Revised Apr. 2013, 16 pages.
Texas Instruments, "LM3886 Overture Audio Power Amplifier Series High-Performance 68W Audio Power Amplifier w/Mute", Datasheet SNAS091C, May 1999—Revised Mar. 2013, 31 pages.

* cited by examiner

*Primary Examiner* — Henry Choe
(74) *Attorney, Agent, or Firm* — Knobbe Martens Olson & Bear LLP (57) ABSTRACT

An amplifier system may include a current source, an impedance element responsive to a current change, and a feedback controller generating a control signal based on impedance element response. Current source may supply current to a pair of output elements, one of which being controlled by an integrator, and a portion of the integrator. Impedance element may have terminals coupled to inputs of the output elements and may be configured to experience a change in voltage based on a change in current supplied to its input. Feedback controller may have a pair of inputs coupled to the terminals of impedance element and an output to control the current source based on a detected change in voltage across the impedance element. Current source may be varied based on the control signal to maintain a constant current supplied to the input of the impedance elements.

30 Claims, 6 Drawing Sheets

DYNAMIC CURRENT SOURCE FOR AMPLIFIER INTEGRATOR STAGES

BACKGROUND

The present invention relates to amplifier systems and, in particular, to improving symmetry of such systems.

In many bipolar amplifier circuits, the maximum output current is usually limited by the base current of the amplifier output devices. These output devices are connected to the amplifier's output terminal and drive the amplifier's load. Therefore, the amplifier's load driving capabilities may be set by the capabilities of the output devices.

A typical amplifier output stage has asymmetric source and sink capabilities. The base current of one of the output devices may be provided by an integrator within the output stage or within the preceding gain stage. A typical non-complementary integrator can provide large currents to the base of one of the output devices, allowing the output device to pull strongly in its designated direction (i.e., it can sink or source a large output current). The base current of the other output device may be provided by a fixed current source, which limits the strength at which the output device can pull in its designated direction (i.e., it limits the maximum sink or source current of the device). Thus, the second output device may not pull as strongly as the first output device and it may not be able to deliver as large an output current as the first output device.

Multiple approaches have been used to address the asymmetry. One approach has been to employ a Darlington output transistor to increase the strength of the second output device by increasing the ratio of current in the collector terminal as compared to the base terminal of the output transistor, i.e., by increasing the current gain, beta, of the transistor. However, this approach compromises the amplifier's output voltage range, reducing it by approximately one $V_{BE}$. A second approach uses a positive feedback circuit where a portion of the output transistor's collector current is fed back to the base terminal of the respective output transistor. However, due to the nature of using a positive feedback loop, an amplifier employing this technique may become unstable.

Accordingly, there is a need in the art for an amplifier system having improved symmetry in source/sink operations while providing stable operating conditions.

DETAILED DESCRIPTION

Embodiments of the present invention provide an amplifier system having a variable current source for supplying a variable current, an impedance element responsive to a change in current, and a feedback controller for generating a control signal based on the charge at the impedance element. The variable current source may supply current to a circuit path having a pair of output elements and the impedance element. The variable current source may also supply current to at least a portion of the integrator. The impedance element provided in the circuit path may have terminals coupled to the respective inputs of the output elements. The feedback controller may have inputs coupled to the respective terminals of the impedance element and an output to control the variable current source. The feedback controller may detect change in current through the impedance element and may generate a control signal therefrom. The variable current source may vary its output current based on the control signal.

Another embodiment of the present invention provides for a multi-stage amplifier system having a transconductance stage, an integrator stage and an output voltage buffer. The transconductance stage may convert an input voltage to an output current. The integrator stage may convert the output current from the transconductance stage to an output voltage. The output voltage buffer may replicate the output voltage of the integrator stage at the output of the amplifier system, and further includes a variable current source and a controller. The controller being responsive to voltage changes across the inputs of complementary output transistors and generating a control signal for varying the variable current source based on the voltage changes.

The source adjustment techniques encompassed in embodiments of the present invention advantageously may increase the maximum output current capabilities of an amplifier system. Other advantages of embodiments of the present invention include increasing the amplifier output voltage swing and eliminating oscillations due to uncontrolled positive feedback loops.

Figure 1:
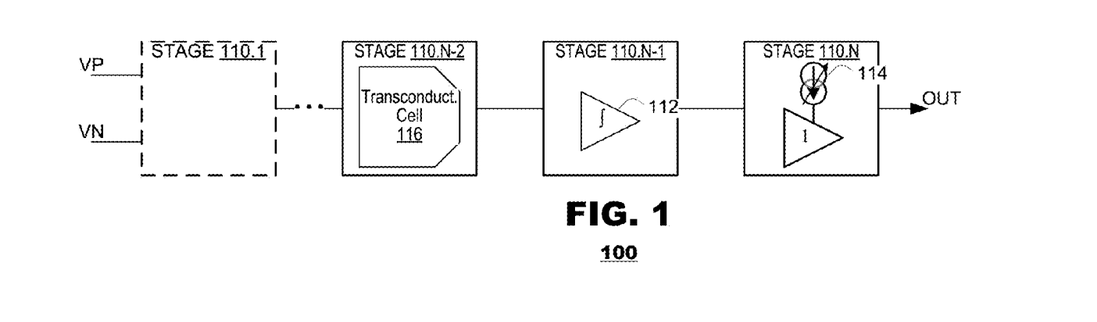
FIG. 1 is a block diagram of an amplifier system according to an embodiment of the present invention.

FIG. 1 is a block diagram of an amplifier system 100 according to an embodiment of the present invention. The amplifier system 100 may include a plurality of stages 110.1-110.N to apply gain to an input signal, provided at input terminals VP and VN, at an output terminal OUT. As illustrated, the system 100 may include an output stage 110.N preceded by a plurality of gain stages that include an integrator 112.

The output stage 110.N is illustrated as a voltage follower. The voltage follower stage 110.N may buffer the output of the integrator stage 110.N-1 at the output terminal OUT of amplifier system 100. The output stage 110.N may have a voltage gain of unity and may supply an output current to the load of amplifier system 100. The output stage 110.N may be biased by an impedance element and by a variable current source 114, according to an embodiment of the present invention, as described hereinafter.

The stage 110.N-1 in the amplifier system 100 is illustrated as an integrator stage. The integrator stage 110.N-1 may integrate an input signal from a preceding stage 110.N-2 and determine an output voltage at an output terminal OUT of amplifier system 100. The integrator stage 110.N-1 may be biased by the variable current source 114 in the output stage 110.N, according to an embodiment of the present invention, as described hereinafter.

As discussed, the amplifier system 100 typically will be a multi-stage system. The system may include other stages, beyond the output stage 110.N and integrator stage 110.N-1, to tailor the system 100 to meet individual design needs. For example, the system 100 also may include a stage 110.N-2 that includes a transconductance cell 116. The transconductance cell 116 may supply an input current to the integrator stage 110.N-1 based on a voltage signal input to it. Other implementations may include a greater number of stages, for example four or more, to suit individual design needs.

In the embodiment illustrated in FIG. 1, the amplifier stages are illustrated as differential circuits. The principles of the present invention may be applied to single-ended voltages, where the input signal is defined with respect to ground.

Figure 2:
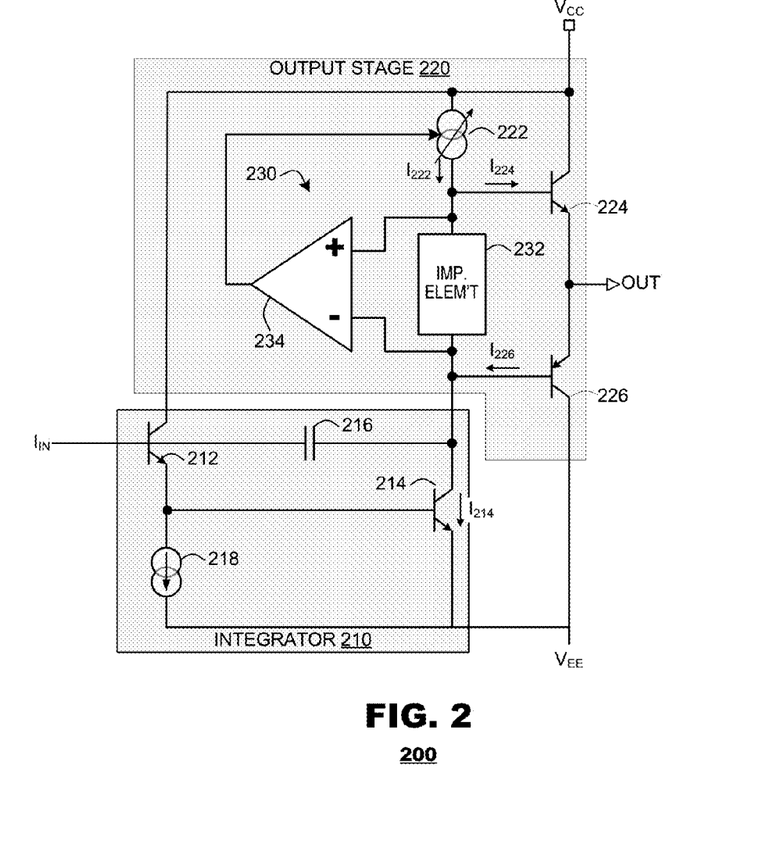
FIG. 2 illustrates an exemplary circuit that may be implemented in an amplifier system according to an embodiment of the present invention.

FIG. 2 is a circuit diagram that illustrates the cascade of an integrator stage 210 and an output stage 220 according to an embodiment of the invention. The output stage may include a variable current source 222, a pair of complementary output transistors 224, 226 and a current controller 230. The current controller 230 may establish a feedback loop that modulates output of the current source 222 in response to changing conditions in the output stage 220.

The integrator stage 210 may include a pair of transistors 212, 214, a capacitor 216 and a current source 218. A base of the first transistor 212 may be coupled to an input terminal for an input signal $I_{IN}$. An emitter of the first transistor 212 may be coupled to a base of the second transistor 214 and also to the current source 218, which sinks a predetermined current to ground. A capacitor 216 may couple the input terminal $I_{IN}$ to a collector of the second transistor 214. A collector of transistor 214 also may be coupled to a current path from the output stage 220 that includes the variable current source 222. A collector of the first transistor 212 may be coupled to a supply voltage $V_{CC}$.

The integrator stage 210 may integrate an input current $I_{IN}$, which may determine an output voltage at an output terminal OUT via output transistors 224, 226. The variable current source 222 may provide a source current $I_{222}$ for a leg of the integrator 210 that includes transistor 214. Portions of this source current $I_{222}$ may be diverted to the output transistors 224 and/or 226 during operation of the system 200. The current controller 230 may generate a control signal for the current source 222 based on a voltage difference across the input terminals of the output transistors 224 and 226.

In the embodiment depicted in FIG. 2, an output transistor 224 may provide the output current sourcing capabilities with a maximum sourced output provided by:

$$I_{OUT} = (1+\beta_{224}) \cdot I_{224}, \quad \text{Eq. 1}$$

where $I_{224}$ represents an amount of current $I_{222}$ that is diverted to the base terminal of output transistor 224, as detailed hereinafter, and $\beta_{224}$ represents the ratio of the current at the collector terminal to the current at the base terminal of output transistor 224.

An output transistor 226 may provide the output current sinking capabilities of the output stage 220. In the integrator, a transistor 214 may provide current for the base terminal of output transistor 226. The transistor 214 is able to sink a considerable amount of current thereby enabling output transistor 226 to provide a large output current. The output current that transistor 226 may be capable of sinking is provided by:

$$I_{OUT} = (1+\beta_{226}) \cdot I_{226} \approx (1+\beta_{226}) \cdot \beta_{214} \cdot (1+\beta_{212}) \cdot I_{IN}, \quad \text{Eq. 2}$$

where $I_{226}$ represents the base current of transistor 216 (and may be approximately the value of the current sunk by transistor 214 to the base terminal of transistor 226), $\beta_{226}$ represents the ratio of the current at the collector terminal to the current at the base terminal of output transistor 226, $\beta_{212}$ represents the ratio of the current at the collector terminal to the current at the base terminal of transistor 212, and $\beta_{214}$ represents the ratio of the current at the collector terminal to the current at the base terminal of transistor 214.

The current controller 230 may control the current source 222 to vary the source current $I_{222}$ based on changes in the stage's output voltage. The current controller 230 may include an impedance element 232 and an amplifier 234. The impedance element 232 may be provided in a current path between the current source 222 and the integrator 210. Impedance element 232 may be configured to set the voltage drop across the base terminals of output transistor 224 and output transistor 226. The amplifier 234 may take inputs from either side of the impedance element 232 and may generate a control signal to the current source 222 based on the voltage across those inputs. In one embodiment of the present invention, the amplifier 234 may detect a change in the voltage across the impedance element 232, and as a result a change in the current through the impedance element 232. The amplifier 234 may also be a differential input transconductance cell.

During operation, the current source 222 may supply a current $I_{222}$ to the integrator 210, and consequently to impedance element 232. When the output stage 200 is required to source current to the output terminal OUT via output transistor 224, the output transistor 224 may divert current (shown as $I_{224}$) from the current source 222 to its base terminal, thereby decreasing the current supplied to integrator 210 by an amount equal to the diverted current $I_{224}$. The impedance element 232, which may be situated between the base terminals of output transistors 224, 226, may undergo a change in voltage that reflects a change in current flowing through the impedance element 232. In this way, the impedance element 232 may experience a change in voltage as a result of output transistor 224 diverting a portion of current supplied by current source 222. The amplifier 234 may detect changes in current and/or voltage across impedance element 232 and may generate a control signal which may be fed back to current source 222, via a feedback loop. Based on the control signal, current source 222 may adjust its output current ($I_{222}$) to restore the voltage across impedance element 232 to the original level.

Accordingly, the current controller 230 may compensate for varying operating conditions in the output stage by varying the output current of the current source 222. If conditions cause a diversion of current $I_{224}$ into the base terminal of output transistor 224 (which otherwise would cause a decrease of current passing through the impedance element 232 and, by extension, the voltage across it), the current controller 230 may cause the current source 222 to increase its output current to keep the current flow through the impedance element 232 at a steady level. In effect, the current source 222 increases its output current to match the increase in current $I_{224}$ flowing into the output transistor 224. Similarly, if conditions decrease an amount of current $I_{224}$ diverted into the base terminal of output transistor 224 (which otherwise would cause an increase of the voltage across the impedance element 232), the current controller 230 may cause the current source 222 to decrease its output current to keep the current flow through the impedance element 232 at a steady level. In effect, the current source 222 decreases its output current to match the decrease in current $I_{224}$ flowing into the output transistor 224.

In an embodiment, a quiescent value of the current source 222 may be set by circuit designers by controlling design parameters of the amplifier 234 and/or impedance element 232, specifically, by setting an offset voltage of amplifier 234 and/or setting an impedance value of the impedance element 232.

Integrator 210 may be implemented according to a variety of circuit topologies. The integrator may be configured to integrate an input current to the amplifier stage, which may determine an output voltage at an output terminal of the amplifier stage. FIG. 2 illustrates an exemplary integrator 210, which may include a cascade of transistors 212 and 214 and a capacitor 216. The current source 222 may provide a bias current to transistor 214 of integrator 210 and the current source 218 may provide a bias current to transistor 212.

Figure 3:
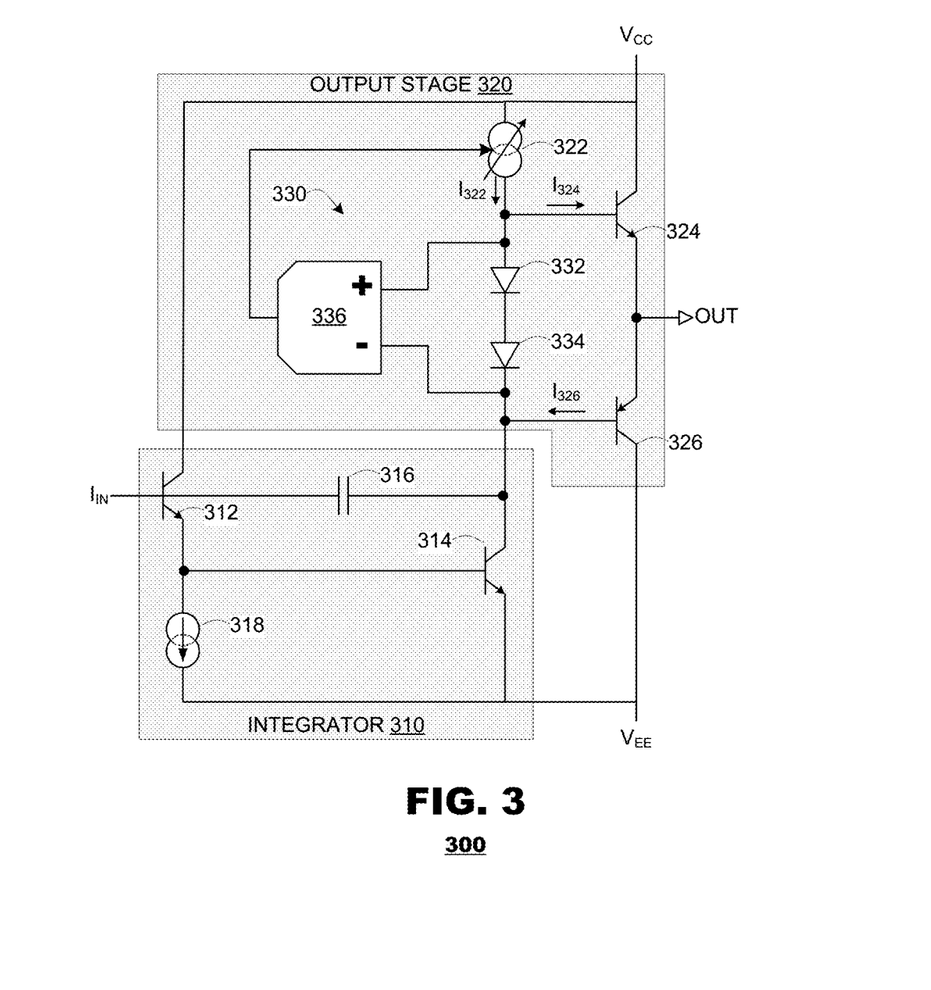
FIG. 3 illustrates an exemplary circuit that may be implemented in an amplifier system according to another embodiment of the present invention.

FIG. 3 is a circuit diagram that illustrates the cascade of an integrator stage 310 and an output stage 320 according to another embodiment of the invention. The output stage 320 may include a variable current source 322, a pair of complementary output transistors 324, 326 and a current controller 330. The current controller 330 may establish a feedback loop that modulates output current of the variable current source 322 in response to changing conditions in the output stage 320.

The integrator 310 may include a pair of transistors 312, 314, a capacitor 316 and a current source 318. A base of the first transistor 312 may be coupled to an input terminal for input signal $I_{IN}$. An emitter of the first transistor may be coupled to a base of the second transistor 314 and also to the current source, which sinks a predetermined current to ground. A capacitor 316 may couple the input terminal $I_{IN}$ to a collector of the second transistor 314. A collector of transistor 314 may be coupled to a current path from the output stage 320 that includes the current source 322. A collector of the first transistor 312 may be coupled to a supply voltage $V_{CC}$.

The integrator 310 may integrate an input current $I_{IN}$, which may determine an output voltage at an output terminal OUT via output transistors 324, 326. The current source 322 may provide a source current for a leg of the integrator 310 that includes transistor 314. The current controller 330 may generate a control signal for the current source 322 based on a voltage difference across the input terminals of the output transistors 324 and 326.

In the embodiment depicted in FIG. 3, an output transistor 324 may provide the output current sourcing capabilities with a maximum sourced output provided by:

$$I_{OUT}=(1+\beta_{324})*I_{324} \qquad \text{Eq. 3}$$

where $I_{324}$ may be the value of the current sourced from current source 322 to the base terminal of output transistor 324, as detailed hereinafter, and $\beta_{324}$ represents the ratio of the current at the collector terminal to the current at the base terminal of output transistor 324.

An output transistor 326 may provide the output current sinking capabilities of the output stage 320. In the integrator 310, a transistor 314 may provide current for the base terminal of output transistor 326. The transistor 314 is able to sink a considerable amount of current thereby enabling output transistor 326 to provide a large output current. The output current that transistor 326 may be capable of sinking is provided by:

$$I_{OUT}=(1+\beta_{326})*I_{326}\approx(1+\beta_{326})*\beta_{314}*(1+\beta_{312})*I_{IN}, \qquad \text{Eq. 4}$$

where $I_{326}$ is the base current of transistor 326 (and may be approximately the value of the current sunk by transistor 314 to the base terminal of transistor 326), $\beta_{326}$ represents the ratio of the current at the collector terminal to the current at the base terminal of output transistor 326, $\beta_{312}$ represents the ratio of the current at the collector terminal to the current at the base terminal of transistor 312, and $\beta_{314}$ represents the ratio of the current at the collector terminal to the current at the base terminal of transistor 314.

The current controller 330 may control the current source 322 to vary the source current based on changes in the stage's output voltage. The current controller 330 may include a pair of serially-connected diodes 332, 334 and an amplifier 336. The diodes 332, 334 may be provided in a current path between the current source 322 and the integrator 310. Diodes 332, 334 may be configured to set the voltage drop across the base terminals of output transistor 324 and output transistor 326. The amplifier 336 may take inputs from either side of the diodes 332, 334 and may generate a control signal to the current source 322 based on the voltage across those inputs. In one embodiment of the present invention, amplifier 336 may detect a change in the voltage across two nodes, and as a result a change in the current through diodes 332, 334. Amplifier 336 may be a differential input transconductance cell. Diodes 332, 334 may be provided as diode-connected transistors.

During operation, the current source 322 may supply a current to integrator 310, and consequently to diodes 332, 334, at a value of $I_{322}$. When the output stage 300 is required to source current to the output terminal OUT via output transistor 324, the output transistor 324 may divert current (shown as $I_{324}$) from the current source 322 to its base terminal, thereby decreasing the current supplied to integrator 310 by an amount equal to the diverted current $I_{324}$. The diodes 332, 334, which may be situated between the base terminals of output transistors 324, 326, may undergo a change in voltage that reflects a change in current flowing through the diodes 332, 334. In this way, the diodes 332, 334 may experience a change in voltage as a result of output transistor 324 diverting a portion of current supplied by current source 322. The amplifier 336 may detect changes in current and/or voltage across diodes 332, 334 and generate a control signal which may be fed back to current source 322, via a feedback loop. Based on the control signal, current source 322 may adjust its output current ($I_{322}$) to restore the voltage across diodes 332, 334 to the original level.

Accordingly, the current controller 330 may compensate for varying operating conditions in the output stage by varying the output current of the current source 322. If conditions cause a diversion of current $I_{324}$ into the base terminal of output transistor 324 (which otherwise would cause a decrease of current passing through the diodes 332, 334 and, by extension, the voltage across it), the current controller 330 causes the current source 322 to increase its output current to keep the current flow through the diodes 332, 334 at a steady level. In effect, the current source 322 increases its output current to match the increase in current $I_{324}$ flowing into the output transistor 324. Similarly, if conditions decrease an amount of current $I_{324}$ diverted into the base terminal of output transistor 324 (which otherwise would cause an increase of the voltage across the diodes 332, 334), the current controller 330 causes the current source 322 to decrease its output current to keep the current flow through the diodes 332, 334 at a steady level. In effect, the current source 322 decreases its output current to match the decrease in current $I_{324}$ flowing into the output transistor 324.

In an embodiment, a quiescent value of the current source 322 may be set by circuit designers by controlling design parameters of the amplifier 336 and/or diodes 332, 334, specifically, by setting an offset voltage of amplifier 336 and/or setting the saturation current of the diodes 332, 334.

Integrator 310 may be implemented according to a variety of circuit topologies. The integrator may be configured to integrate an input current to the amplifier stage, which may determine an output voltage at an output terminal of the amplifier stage. FIG. 3 illustrates an exemplary integrator 310, which may include a cascade of transistors 312 and 314 and a capacitor 316. The current source 322 may provide a bias current to transistor 314 of integrator 310 and the current source 318 may provide a bias current to transistor 312.

Figure 4:
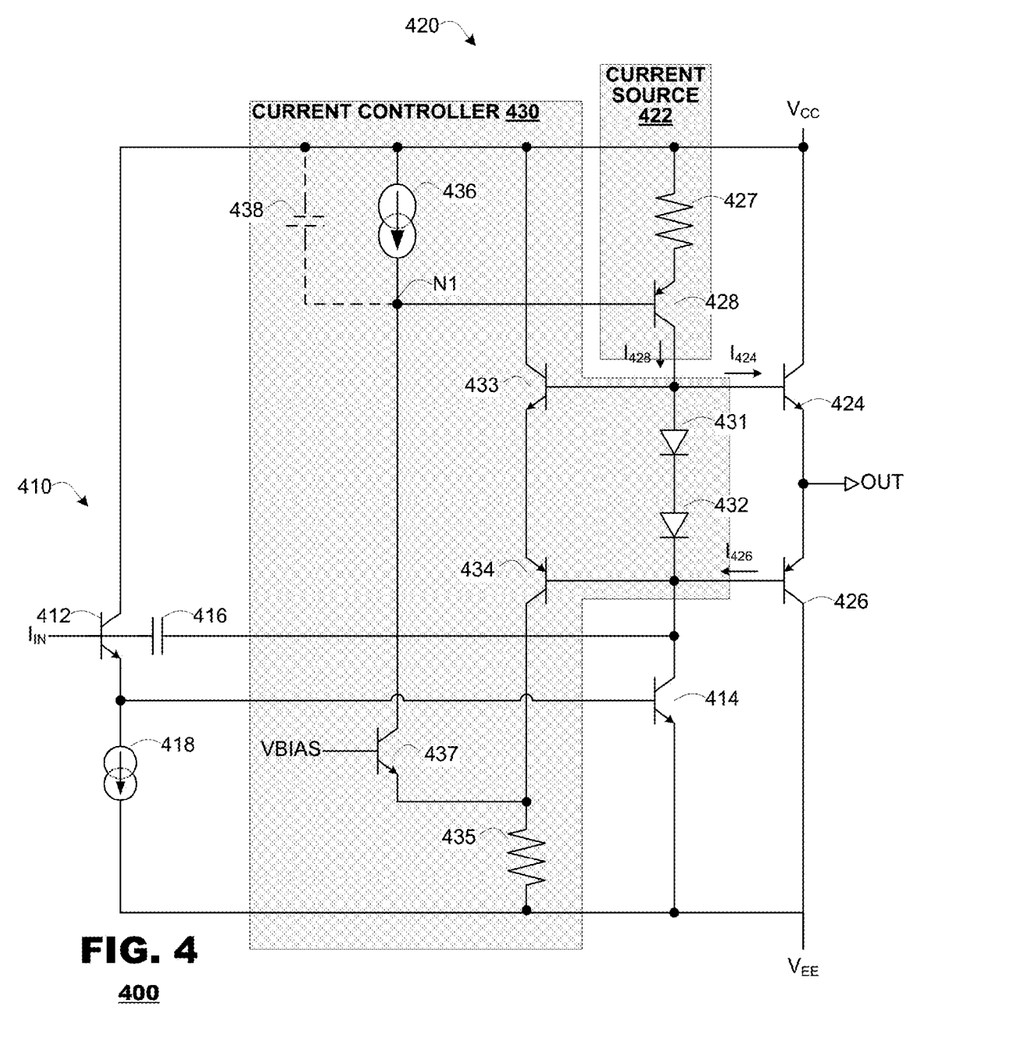
FIG. 4 illustrates an exemplary circuit that may be implemented in an amplifier system according to a further embodiment of the present invention.

FIG. 4 illustrates an amplifier stage 400 according to another exemplary embodiment of the present invention. The amplifier stage 400 may include an integrator 410 and an output stage 420. The output stage 420 may include a variable current source 422, a pair of complementary output transistors 424, 426 and a current controller 430. The current controller 430 may establish a feedback loop that modulates output current of the current source 422 in response to changing conditions in the output stage 420.

The integrator 410 may include a pair of transistors 412, 414, a capacitor 416 and a current source 418. A base of the first transistor 412 may be coupled to an input terminal for input signal $I_{IN}$. An emitter of the first transistor 412 may be coupled to a base of the second transistor 414 and also to the current source 418, which sinks a predetermined current to ground. A capacitor 416 may couple the input terminal $I_{IN}$ to a collector of the second transistor 414. A collector of transistor 414 may be coupled to a current path from the output stage 420 that includes the variable current source 422. A collector of the first transistor 412 may be coupled to a supply voltage $V_{CC}$.

The integrator 410 may integrate an input current $I_{IN}$, which may determine an output voltage at an output terminal OUT via output transistors 424, 426. The current source 422 may provide a source current for a leg of the integrator 410 that includes transistor 414. The current controller 430 may generate a control signal for the current source 422 based on a voltage difference across the input terminals of the output transistors 424 and 426.

In the embodiment depicted in FIG. 4, an output transistor 424 may provide the output current sourcing capabilities with a maximum sourced output provided by:

$$I_{OUT}=(1+\beta_{424})*I_{424}, \quad \text{Eq. 5}$$

where $I_{424}$ may be the value of the current sourced from current source 422 to the base terminal of output transistor 424, as detailed hereinafter, and $\beta_{424}$ represents the ratio of the current at the collector terminal to the current at the base terminal of output transistor 424.

An output transistor 426 may provide the output current sinking capabilities of the output stage 420. In the integrator, a transistor 414 may provide current for the base terminal of output transistor 426. The transistor 414 is able to sink a considerable amount of current thereby enabling output transistor 426 to provide a large output current. The output current that transistor 426 may be capable of sinking is provided by:

$$I_{OUT}=(1+\beta_{426})*I_{426}\approx(1+\beta_{426})*\beta_{414}*(1+\beta_{412})*I_{IN}, \quad \text{Eq. 6}$$

where $I_{426}$ is the base current of transistor 416 (and may be approximately the value of the current sunk by transistor 414 to the base terminal of transistor 426), $\beta_{426}$ represents the ratio of the current at the collector terminal to the current at the base terminal of output transistor 426, $\beta_{412}$ represents the ratio of the current at the collector terminal to the current at the base terminal of transistor 412, and $\beta_{414}$ represents the ratio of the current at the collector terminal to the current at the base terminal of output transistor 414.

The current controller 430 may control the current source 422 to vary the source current based on changes in the stage's output voltage. The current controller 430 may include a pair of serially-connected diodes 431, 432, a pair of sense transistors 433, 434, a resistor 435, a current source 436 and another transistor 437.

The transistors 433 and 434 may represent inputs to the current controller 430 that sense a voltage drop across the diodes 431 and 432. The transistors 433, 434 and resistor 435 may form a first current path between the supply voltages $V_{CC}$ and $V_{EE}$. The transistors 433, 434 may form the input trans-conductance stage of current controller 430. Diodes 431, 432 may be provided as diode-connected transistors.

The current source 436 may supply a predetermined current to a high impedance node N1 within the current controller 430 that is coupled to an input of the current source 422. Transistor 437 may have a bias voltage VBIAS applied to its base and may have a bias current equal to the output current of current source 436 plus the input current of current source 422. Current that flows from node N1 through the bias transistor 437 also flows through the resistor 435. Current from transistor 437 that exceeds the current sourced by the current source 436 may be input to the current source 422. The cascade transistor 437, current source 436 and shared resistor 435 may form a current buffer stage that that conveys the signal current from the input trans-conductance stage of the current controller 430 to node N1, the output of the current controller 430. In an embodiment, the resistor 435 may be replaced by a current source (not shown) that sinks a fixed amount of current.

The current source 422 is illustrated as a resistor 427 and a transistor 428 coupled in series between the supply voltage $V_{CC}$ and the first diode 431. A base of the transistor 428 may be coupled to node N1 within the current controller 430, and may represent the input node of the current source 422. A collector of the transistor 428 may represent the output node of the current source 422.

During operation, as voltages across the diodes 431, 432 vary, the current in transistors 433, 434 also may vary, which causes a varying voltage to be presented at the resistor 435. Variations in voltage at the resistor 435 may cause corresponding variations in current conducted by the cascode transistor 437. Thus, when the cascode transistor 437 sinks less current, a smaller amount of current is pulled from the base of transistor 428 in the current source 422, and the output current of current source 422 is decreased. Similarly, when the cascode transistor 437 sinks a greater amount of current, more current is pulled from the base of transistor 428 in the current source 422, and the output current of current source 422 is increased. Thus, the current controller 430 may modulate current output by the current source 422.

Optionally, the current controller 430 also may include a capacitor 438 or other circuitry to set the frequency response of the current controller 430. The capacitor 438 may filter spikes or other signal transients that are unwanted in the circuit.

Figure 5:
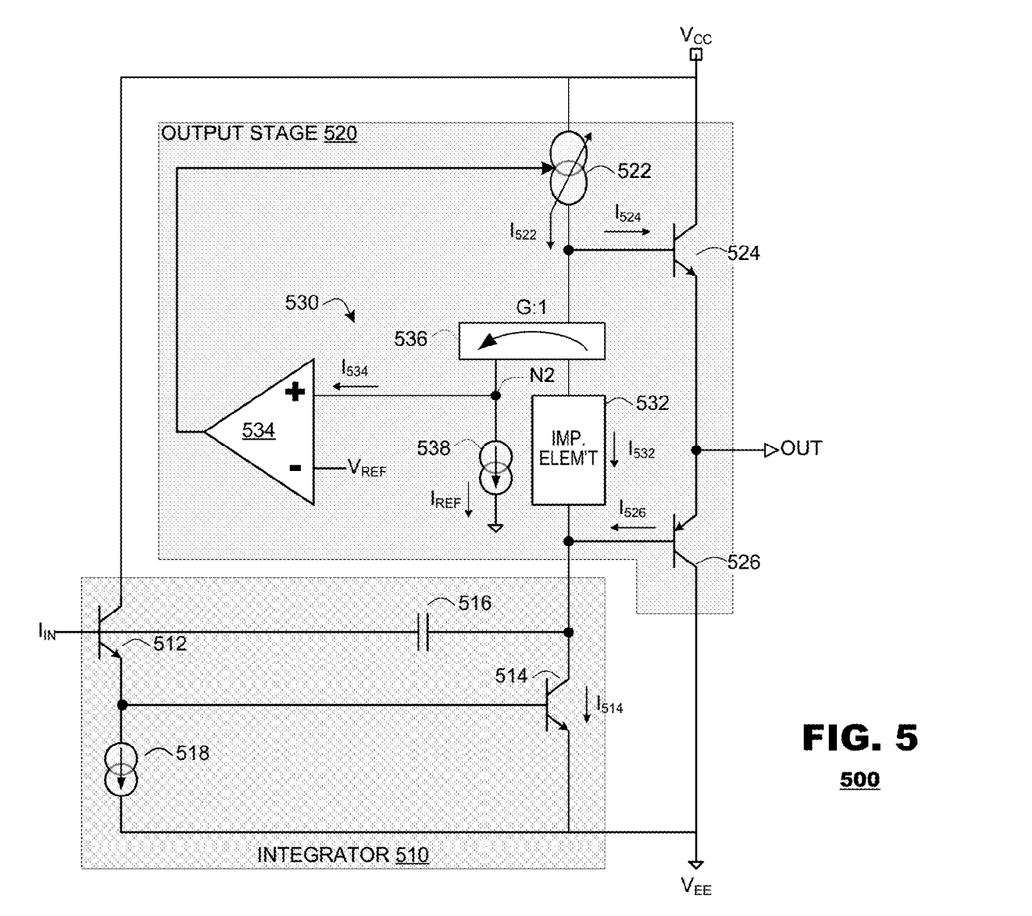
FIG. 5 illustrates an exemplary circuit that may be implemented in an amplifier system according to another embodiment of the present invention.

FIG. 5 is a circuit diagram that illustrates the cascade of an integrator stage 510 and an output stage 520 according to another embodiment of the invention. The output stage 520 may include a variable current source 522, a pair of complementary output transistors 524, 526 and a current controller 530. As in the prior embodiments, the current controller 530 may establish a feedback loop that modulates output current of the variable current source 522 in response to changing conditions in the output stage 520.

The integrator 510 may include a pair of transistors 512, 514, a capacitor 516 and a current source 518. A base of the first transistor 512 may be coupled to an input terminal for input signal $I_{IN}$. An emitter of the first transistor may be coupled to a base of the second transistor 514 and also to the current source 518, which sinks a predetermined current to ground. A capacitor 516 may couple the input terminal $I_{IN}$ to a collector of the second transistor 514. A collector of transistor 514 may be coupled to a current path from the output stage 520 that includes the current source 522. A collector of the first transistor 512 may be coupled to a supply voltage $V_{CC}$.

The integrator 510 may integrate an input current $I_{IN}$, which may determine an output voltage at an output terminal OUT via output transistors 524, 526. The current source 522 may provide a source current for a leg of the integrator 510 that includes transistor 514. The current controller 530 may generate a control signal for the current source 522 based on the current flowing in the elements that set a voltage difference across the input terminals of the output transistors 524 and 526.

In the embodiment depicted in FIG. 5, an output transistor 524 may provide the output current sourcing capabilities with a maximum sourced output provided by:

$$I_{OUT}=(1+\beta_{524})*I_{524},\quad\text{Eq. 7}$$

where $I_{524}$ may be the value of the current sourced from current source 522 to the base terminal of output transistor 524, as detailed hereinafter, and $\beta_{524}$ represents the ratio of the current at the collector terminal to the current at the base terminal of output transistor 524.

An output transistor 526 may provide the output current sinking capabilities of the output stage 520. In the integrator, a transistor 514 may provide current for the base terminal of output transistor 526. The transistor 514 is able to sink a considerable amount of current thereby enabling output transistor 526 to provide a large output current. The output current that transistor 526 may be capable of sinking is provided by:

$$I_{OUT}=(1+\beta_{526})*I_{526}\approx(1+\beta_{526})*\beta_{514}*(1+\beta_{512})*I_{IN},\quad\text{Eq. 8}$$

where $I_{526}$ is the base current of transistor 516 (and may be approximately the value of the current sunk by transistor 514 to the base terminal of transistor 526), $\beta_{526}$ represents the ratio of the current at the collector terminal to the current at the base terminal of output transistor 526, $\beta_{512}$ represents the ratio of the current at the collector terminal to the current at the base terminal of output transistor 512, and $\beta_{514}$ represents the ratio of the current at the collector terminal to the current at the base terminal of output transistor 514.

The current controller 530 may control the current source 522 to vary the source current based on operational changes in the output stage. The current controller 530 may include an impedance element 532, an amplifier 534, a current mirror 536 and a current sink 538. The impedance element 532 may be located in a circuit path through which current from the current source 522 passes to the integrator 510. The current mirror 536 includes a common node connected to the output of current source 522 and to the base of transistor 524, an input node connected to the impedance element 532 and an output node connected to an input of the amplifier 534 and to an output of the current sink 538 (shown as node N2). The current mirror 536 may mirror current that flows through the impedance element 532 to node N2 with a current gain of G. The current sink 538 may sink a predetermined current $I_{REF}$ from node N2. Any difference between the current supplied to node N2 by the current mirror 536 and the current sunk from node N2 by current sink 538 may be supplied to the input of the amplifier 534 as current $I_{534}$.

The current source 522 may supply a current to the common node of current mirror 536 at a value of $I_{522}$. The current $I_{522}$ may split to the input node of current mirror 536 that includes the impedance element 532, and to the output node of current mirror 536 (i.e. to node N2). At node N2, the current supplied by the current mirror 536 is compared to the output current of the current sink 538, $I_{REF}$. If these currents are not equal, it may cause the amplifier 534 to generate a control signal which may be fed back to the current source 522, via a feedback loop. Based on the control signal, current source 522 may adjust its output current ($I_{522}$) to restore equality between the current supplied by the current mirror 536 and the output current of the current sink 538. Doing so effectively controls the current source 522 to ensure that the current that passes through the impedance element 532 ($I_{532}$) equals $I_{REF}$/G, where G represents the gain of the current mirror 536. G typically may be set to 1 but it may be tailored to suit individual application needs.

When the output stage 520 is required to source current to the output terminal OUT via output transistor 524, the output transistor 524 may divert current (shown as $I_{524}$) from the current source 522 to its base terminal, thereby decreasing the current $I_{532}$ that passes through the impedance element and also decreasing the current supplied by the current mirror 536 to node N2. The comparison at node N2 may cause the amplifier 534 to control the current source 522 to increase its output and return the current $I_{532}$ at the impedance element 532 to $I_{REF}$/G.

Accordingly, the current controller 530 may compensate for varying operating conditions in the output stage 520 by varying the output current of the current source 522. If conditions cause a diversion of current $I_{524}$ into the base terminal of output transistor 524 (which otherwise would cause a decrease of current passing through the impedance element 532), the current controller 530 may cause the current source 522 to increase its output current to keep the current flow through the impedance element 532 at a steady level. In effect, the current source 522 increases its output current to match the increase in current $I_{524}$ flowing into the output transistor 524. Similarly, if conditions decrease an amount of current $I_{524}$ diverted into the base terminal of output transistor 524 (which otherwise would cause an increase of the current through the impedance element 532), the current controller 530 may causes the current source 522 to decrease its output current to keep the current flow through the impedance element 532 at a steady level. In effect, the current source 522 decreases its output current to match the decrease in current $I_{524}$ flowing into the output transistor 524.

In an embodiment, a quiescent value of the current source 522 may be set by circuit designers by controlling design parameters of the current mirror 536, and/or current sink 538, specifically, by setting the current gain G of the current mirror 536, and by setting the output current $I_{REF}$ of current sink 538.

Integrator 510 may be implemented according to a variety of circuit topologies. The integrator may be configured to integrate an input current to the amplifier stage, which may determine an output voltage at an output terminal of the amplifier stage. FIG. 5 illustrates an exemplary integrator 510, which may include a cascade of transistors 512 and 514 and a capacitor 516. The current source 522 may provide a bias current to transistor 514 of integrator 510 and the current source 518 may provide a bias current to transistor 512.

Figure 6:
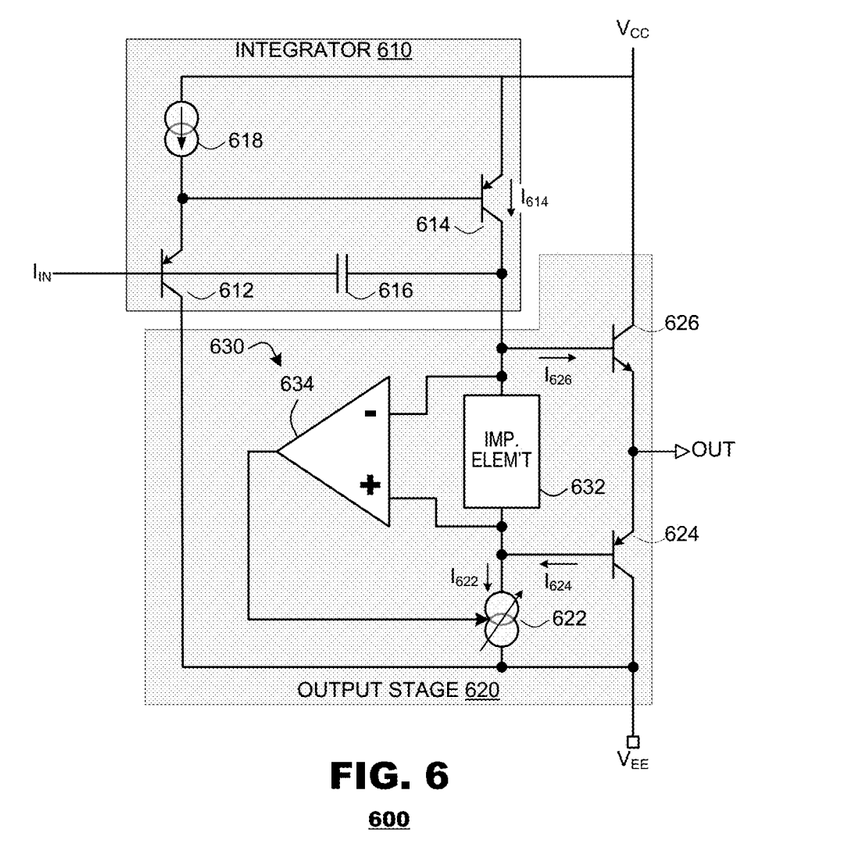
FIG. 6 illustrates an exemplary circuit that may be implemented in an amplifier system according to a further embodiment of the present invention.

The foregoing description of the present invention describe circuit embodiments in which a variable current source supplies a bias current to an output device that, when active, pulls an output voltage OUT to a first supply voltage $V_{CC}$. In these examples, a second output device is controlled by an integrator to pull the output voltage to a second supply voltage $V_{EE}$. The principles of the present invention are not so limited. Other embodiments of the present invention permit the orientation of the current sources and integrators to be inverted—to cause a variable current source to supply a bias current to an output device that pulls the output voltage to $V_{EE}$ and to cause an integrator to control an output device that pulls the output voltage to $V_{CC}$. In such embodiments, the circuit topologies illustrated in FIGS. 2-5 the types of transistors used in those circuits are inverted. FIG. 6 provides an example of one such inversion, which corresponds to FIG. 2. Inversions of the circuits illustrated in FIGS. 3-5 also may occur.

Figure 7:
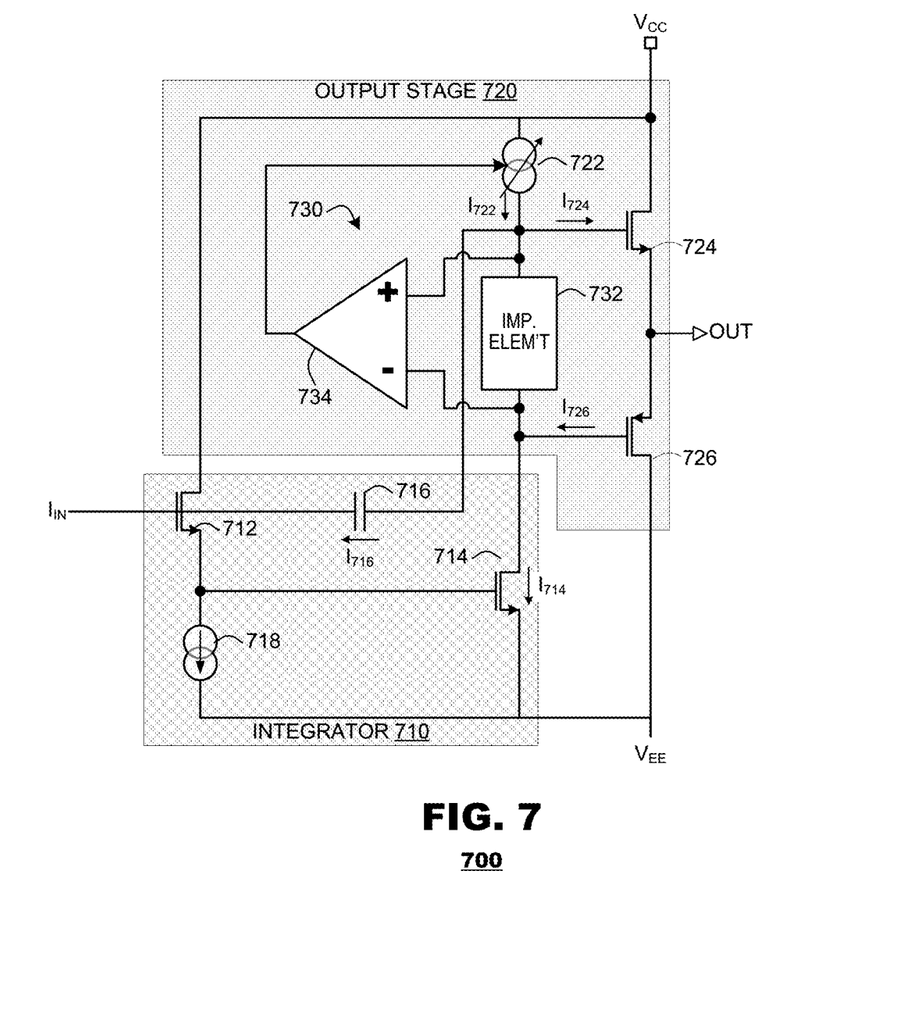
FIG. 7 illustrates an exemplary circuit that may be implemented in an amplifier system according to another embodiment of the present invention.

The principles of the present invention also apply to output stages having different circuit topologies. One such topology is illustrated in FIG. 7 in which an integrator stage 710 and output stage are connected in cascade. In this example, the integrator stage 710 may include a pair of transistors 712, 714, a capacitor 716 and a current sink 718. The transistors 712, 714 of the integrator stage 710 (and transistors 724, 726 of the output stage 720, discussed below) are illustrated as MOS transistors but they may be provided as BJT transistors, JFET transistors or any other transistor technology.

In this embodiment, the input signal $I_{IN}$ may be provided to a gate of a first transistor 712 and to a first terminal of the capacitor 716. A source of the transistor 712 may be coupled to a terminal of the current sink 718 and to a gate of the second transistor 714. A drain of the first transistor 712 may be connected to a supply voltage $V_{CC}$ while a drain of the second transistor 714 may be connected to a current leg from the output stage 720. A source of the second transistor 714 and a second terminal of the current sink 718 may be connected to a second supply voltage $V_{EE}$.

The output stage 720 may include a variable current source 722, a pair of output transistors 724, 726 and a current controller 730. The current controller 730 is illustrated as having an architecture similar to the embodiment of FIG. 2—it may include an impedance element 732 and an amplifier 734. Terminals of the impedance element 732 may be connected to gates of the output transistors 724, 726. Terminals of the amplifier 734 also may be connected to gates of the output transistors 724, 726 and, by extension, to the terminals of the impedance element. An output of the amplifier 734 may be connected to a control input of the current source 722. Alternatively, the current controller 730 may be constructed according to any of the other embodiments illustrated in FIGS. 3-5.

In the embodiment of FIG. 7, a second terminal of the capacitor 716 may be connected to the gate of transistor 724 in the output stage 720. During operation, variations in the input signal IIN may induce currents $I_{716}$ to flow into and out of the capacitor 716. Such variations may be sensed by the current controller 730 as currents to/from the capacitor 716 that are diverted from/to the impedance element 732. The current controller 730 may provide control signals to the current source 722 to increase or decrease its supply of current to counteract the diversion of current.

Several embodiments of the invention are specifically illustrated and/or described herein. However, it will be appreciated that modifications and variations of the invention are covered by the above teachings and within the purview of the appended claims without departing from the spirit and intended scope of the invention. Further variations are permissible that are consistent with the principles described above.

What is claimed is:

1. An amplifier, comprising:
an integrator having an input terminal for an amplifier input signal;
an output circuit having a first circuit path that extends between a pair of supply voltages and having a pair of output elements therein at least one of which is controlled by the integrator;
a variable current source to supply current to a second circuit path that traverses at least a portion of the integrator;
a control system to control the variable current source, the system comprising:
an impedance element provided in the second circuit path having terminals coupled to respective inputs of the output elements; and
a feedback controller to sense operational changes in the impedance element, having an output to control the variable current source.

2. The amplifier of claim 1, further comprising an amplifier output terminal coupled to an intermediate node between the output elements.

3. The amplifier of claim 1, wherein the operational changes comprise a change in voltage based on a diversion of current to at least one of the pair of output elements.

4. The amplifier of claim 3, wherein the impedance element comprises a pair of diodes.

5. The amplifier of claim 3, wherein the impedance element comprises a pair of diode-connected transistors.

6. The amplifier of claim 1, wherein the operational changes comprise a change in current based on a diversion of current to at least one of the pair of output elements.

7. The amplifier of claim 1, wherein the feedback controller comprises an amplifier having inputs coupled to the terminals of the impedance element, and an output of the amplifier is the output of the feedback controller.

8. The amplifier of claim 1, wherein the feedback controller comprises a current mirror having an input node, an output node, and a common node, with the common node and the input node in the second circuit path, a current sink coupled to the output node of the current mirror, and an amplifier with an input coupled to the output node of the current mirror, wherein an output of the amplifier is the output of the feedback controller.

9. The amplifier of claim 1, the integrator further comprising a cascade of a pair of integrator elements and a capacitor, wherein at least one integrator element is coupled to the second circuit path and the capacitor is provided in a third circuit path provided from the input terminal to the second circuit path.

10. The amplifier of claim 1, the variable current source having a resistor and a control element provided in the second circuit path.

11. The amplifier of claim 1, wherein the feedback controller is configured to detect a change in voltage across the impedance element.

12. The amplifier of claim 11, wherein the feedback controller generates the output based on the detected voltage change.

13. The amplifier of claim 11, the feedback controller further including: a pair of sampling elements provided in a third circuit path; a current source and a transistor provided in a fourth circuit path; and a capacitor coupled to one of the pair of supply voltages and the fourth circuit path, wherein the detected change in voltage is integrated into the capacitor to form the output.

14. The amplifier of claim 1, wherein the feedback controller is configured to detect a change in current in the impedance element.

15. The amplifier of claim 14, wherein the feedback controller generates the output based on the detected current change.

16. A method for generating a dynamic current in an amplifier system, comprising:
   controlling at least one of a first output element or a second output element of an output circuit using an integrator, the output circuit having a first circuit path extending between a pair of supply voltages and having the first and second output elements therein;
   supplying current from a variable current source along a second circuit path including an input terminal of the first output element, an impedance element, an input terminal of the second output element, and a portion of the integrator;
   sensing a change in voltage across the respective input terminals of the first and second output elements;
   generating a control signal based on the change in voltage; and
   varying the current supplied by the variable current source based on the control signal to replenish a current siphoned from the variable current source by the first output element.

17. The method of claim 16, further comprising integrating, by the integrator, an input current to the amplifier and determining an output voltage at an output terminal of the amplifier situated between the first and second output elements.

18. The method of claim 16, further comprising sampling the change in voltage across the impedance element.

19. The method of claim 16, wherein the generating step further comprises integrating the change in voltage to develop the control signal.

20. The method of claim 16, wherein the generating step further comprises amplifying change in voltage to develop the control signal.

21. The method of claim 16, further comprising feeding the control signal to the variable current source.

22. A method for generating a dynamic current in an amplifier system, comprising:
   controlling at least one of a first output element or a second output element of an output circuit using an integrator, the output circuit having a first circuit path extending between a pair of supply voltages and having the first and second output elements therein;
   supplying current from a variable current source along a second circuit path including an input terminal of the first output element, an impedance element, an input terminal of the second output element, and a portion of the integrator;
   sensing a current through the impedance element;
   generating a control signal based on the sensed current; and
   varying the current supplied by the variable current source based on the control signal to replenish a current siphoned from the variable current source by the first output element.

23. The method of claim 22, further comprising integrating, by the integrator, an input current to the amplifier and determining an output voltage at an output terminal of the amplifier situated between the first and second output elements.

24. The method of claim 22, further comprising sampling the change in current through the impedance element.

25. The method of claim 22, wherein the generating step further comprises integrating the change in current to develop the control signal.

26. The method of claim 22, further comprising feeding the control signal to the variable current source.

27. The method of claim 22, wherein sensing the current through the impedance element comprises mirroring the current through the impedance element using a current mirror.

28. The method of claim 22, wherein the first output element comprises a first bipolar transistor and the second output element comprises a second bipolar transistor, the method further comprising controlling an output voltage using the first and second bipolar transistors.

29. The method of claim 16, wherein the first output element comprises a first bipolar transistor and the second output element comprises a second bipolar transistor, the method further comprising controlling an output voltage using the first and second bipolar transistors.

30. The apparatus of claim 1, wherein the pair of output elements comprises a first bipolar transistor and a second bipolar transistor.

* * * * *